United States Patent [19]

Vladik

[11] 3,783,347

[45] Jan. 1, 1974

[54] HEAT-EXTRACTING HOUSING FOR SEMICONDUCTOR

[75] Inventor: Liboslav Vladik, Nurnberg, Germany

[73] Assignee: SEMIKRON Gesellschaft fur Gleichrichterbau und Elektronik mbH, Nurnberg, Germany

[22] Filed: July 27, 1972

[21] Appl. No.: 275,887

Related U.S. Application Data

[63] Continuation of Ser. No. 868,328, Oct. 22, 1969, abandoned.

[30] Foreign Application Priority Data

Dec. 20, 1968 Germany.................. P 18 15 989.2

[52] U.S. Cl...... 317/234 R, 317/234 A, 317/234 E, 317/234 G, 317/234 H, 317/234 W, 174/52 S, 174/3

[51] Int. Cl............................. H01l 3/00, H01l 5/00

[58] Field of Search ....................... 317/234, 1, 3, 4, 317/4.1, 11; 174/52 S, 3; 313/108

[56] References Cited

UNITED STATES PATENTS

| | | | |
|---|---|---|---|
| 3,056,898 | 10/1962 | Knochel et al. | 313/108 |
| 3,463,970 | 8/1969 | Gutzwiller | 317/234 |
| 3,469,148 | 9/1969 | Lund | 317/234 |
| 3,539,875 | 11/1970 | Fong et al. | 317/234 |
| 3,548,927 | 12/1970 | Spurling | 317/234 |
| 3,564,109 | 2/1971 | Ruechardt | 317/234 E |
| 3,566,958 | 3/1971 | Zelina | 317/234 |

FOREIGN PATENTS OR APPLICATIONS

| | | | |
|---|---|---|---|
| 1,083,288 | 9/1967 | Great Britain | 317/234 |

*Primary Examiner*—John W. Huckert
*Assistant Examiner*—Andrew J. James
*Attorney*—Spencer & Kaye

[57] ABSTRACT

A semiconductor tablet is in thermally conductive contact with one face of an oxide ceramic plate. A plastic cover is molded around the tablet and is mechanically locked to the oxide ceramic plate. The opposite face of the oxide ceramic plate is free of the plastic cover so that heat extracting means can contact it.

14 Claims, 4 Drawing Figures

PATENTED JAN 1 1974 3,783,347

INVENTOR.
Liboslav Vladik

BY Spencer & Kaye
ATTORNEYS.

HEAT-EXTRACTING HOUSING FOR SEMICONDUCTOR

CROSS REFERENCE TO RELATED APPLICATION

This application is a continuation of application Ser. No. 868,328, filed Oct. 22, 1969, and now abandoned.

BACKGROUND OF THE INVENTION

The present invention relates to a heat extracting, protecting and insulating structure for containing semiconductor devices.

Plastic coverings for semiconductor devices have proven very useful in the industry. However, when such devices are completely encased in plastic material, it is found that they can be easily thermally destroyed. Such encased devices can be overloaded only to a very limited extent.

Attempts have been made to reduce this thermal sensitivity by abutting the surfaces of the plastic housing with metallic cooling structures, by the over-dimensioning of all the parts of the arrangement for the purpose of increasing the heat capacity, by mixing, into the plastic, material that increases the thermal conductivity, or by the embedding of cooling flags in the plastic housing. However, even these methods often do not lead to the desired results. Moreover, they require, especially for semiconductor components for small currents, an often undesired, technical and economic expense.

Semiconductor arrangements which exhibit a metal lower housing part and carrier for semiconductor tablets and a plastic upper housing part are often very expensive with regard to the design of the carrier and its connecting with semiconductor tablets for medium or high current loads. At the beginning of operation with such arrangements, mechanical stressing can occur in the plastic upper housing part due to different coefficients of thermal expansion of the housing parts and the faster heating of the lower part or carrier. Furthermore, such arrangements are not usable in those cases where the carrier must not carry an electrical potential.

SUMMARY OF THE INVENTION

An object of the present invention, therefore, is to provide a semiconductor arrangement having an insulated housing eliminating the above-described disadvantages.

Another object of the invention is to provide an insulated housing allowing improved extraction of heat while maintaining a tight and durable encasement of a semiconductor device.

These as well as other objects which will become apparent in the discussion that follows are achieved, according to the present invention, by providing a plate-shaped carrier made of an electrically insulating oxide ceramic having good thermal conductivity at the desired operational temperatures, on which carrier is mounted at least one semiconductor tablet with interposition of a metal layer. The carrier exhibits protrusions or indentations concentrically arranged on predetermined edge areas. A plastic housing upper part interlocks with the protrusions or indentations and is consequently mechanically secured to the carrier.

DESCRIPTION OF THE PREFERRED EMBODIMENTS

Figure 1:
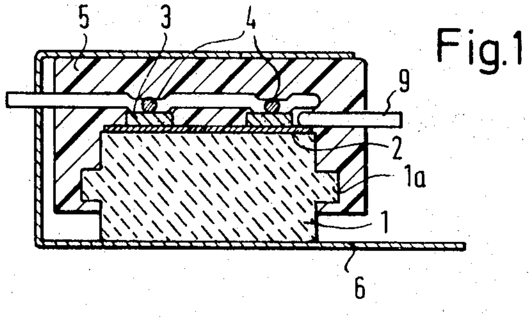
FIG. 1 shows one embodiment of the present invention in section along the line 1—1 of FIG. 2 in which certain of the conductor wires have been brought into the section to show their vertical positioning.

Referring in detail to the Figures, the plate-shaped carrier 1 in FIG. 1 is made from an electrically insulating, thermally conductive oxide ceramic such as aluminum oxide or beryllium oxide. The upper face of carrier 1 has been metallized with metal layer 2. The semiconductor tablets 3 are soldered to the metal layer 2 and current conductors 4 provide additional taps making electrical contact with the tablets 3. Carrier 1 has protrusions 1a on at least two, preferably oppositely situated end surfaces.

The assembly of semiconductor tablets 3, carrier 1, and the portion of the conductors 4 in electrical contact with the tablets is encased by a plastic cover 5. The cover extends to below the protrusions 1a and its mating engagement on these protrusions assures a mechanical securement of carrier and cover. Surface roughness on the carrier improves the quality of the securement of the cover. The lower face of carrier 1, the face opposite to that which bears metal layer 2, is free of the cover 5 and has been made planar and polished to provide good thermal contact with a metal radiator such as cooling plate 6. As shown in FIG. 1, plate 6 has an upper spring clip portion to cause the lower face of carrier 1 to bear with force against plate 6 to improve heat transfer.

Figure 2:
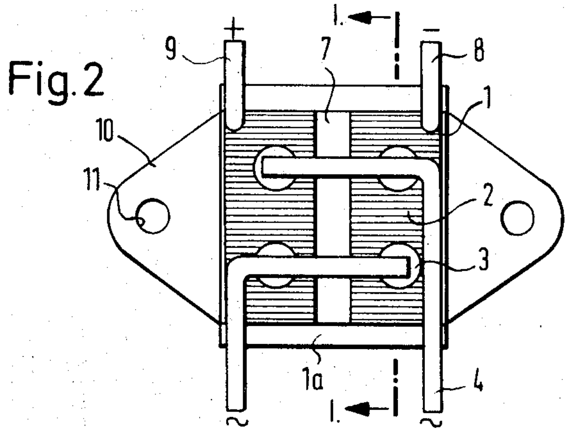
FIG. 2 is a top view of a rectifying bridge circuit with a construction according to FIG. 1, with the upper housing part removed.
Figure 3:
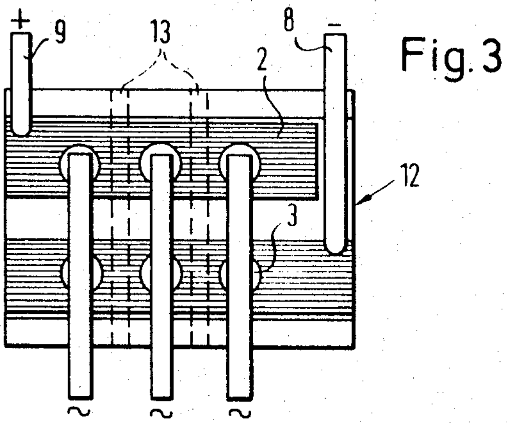
FIG. 3 is a top view of another embodiment of the present invention, with the upper housing part removed.
Figure 4:
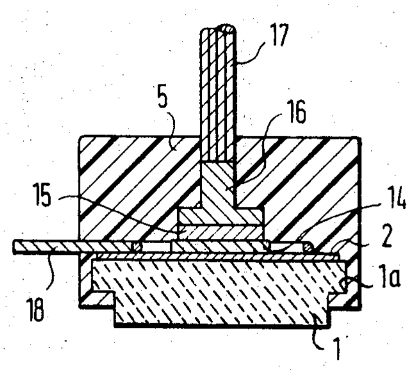
FIG. 4 shows a third embodiment of the invention, in sectional view similar to that of FIG. 1.

The carrier 1 can be round, polygonal, or else rectangular as shown in FIGS. 1 – 3, and indentations can be used as equivalents of the protrusions 1*a*. In FIG. 4, the arrangement is circular in top or bottom view and the protrusion 1a is thus one continuous annular rib.

FIG. 2 shows semiconductor tablets 3 connected in a rectifying bridge circuit. Because of the particular circuit arrangement desired for the semiconductor tablets 3 in this embodiment, the metal layer 2 is divided into two parts by an insulating gap 7. Each of the two parts of metal layer 2 on the carrier 1 carries two semiconductor tablets 3. The current conductors 4, which form the alternating current connections, are situated such that they are sufficiently spaced from parts of other electrical potential to prevent breakdown. The direct current connection is provided by leads 8 and 9 which are situated oppositely to the alternating current connections and connected to the two parts of metal layer 2. These leads are inserted into metallized bores of notches in the carrier 1 to minimize contact resistance.

Plate-shaped lugs 10 with mounting holes 11 are provided on both sides of carrier 1. Resilient washers may be used to prevent tensile stressing by bending of the ceramic material.

FIG. 3 shows a three-phase rectifying bridge circuit 12 constructed in the manner of FIG. 2. The two parts of metal layer 2 form the two poles for connection of the direct current output through leads 8 and 9. The separations between leads 4, 8 and 9 in FIGS. 2 and 3 can be standardized, so that the semiconductor arrangement is readily mountable on a prepared metallized ceramic material.

FIG. 4 shows a rectifier embodiment suitable for high current loads, such as 1,000 amperes surge peak current (one cycle). The protrusion *1a* is arranged flush on the edge of the upper face of carrier 1. Mounted on top of and in electrical contact with metal layer 2 of carrier 1 is semiconductor tablet 14. This tablet is additionally electrically tapped by a conductor unit including contact disk 15 made of refractory metal, for instance, of molybdenum, contact piece 16, and stranded wire connector 17. Conductor 18 makes contact with the metal layer 2 by an end portion which is formed into a ring bearing on the layer 2 and encircling the semiconductor tablet 14. Plastic cover 5 encases the semiconductor tablet 14, the carrier 1, and the conductor unit 15, 16, and 17.

The embodiment of FIG. 4 has the bottom portion of carrier 1 free of plastic cover 5. It may thus be secured to a metallic radiator in the usual manner for flat-bottomed high power semiconductor rectifiers.

The embodiment of FIG. 4 is especially advantageous in that the metallic base of known prior art designs is eliminated. This excludes a significant cost factor, since the manufacture and subsequent treatment of such metallic bases has proved expensive. Also eliminated are the disc of molybdenum or tungsten, which had to be placed between the semiconductor tablet and the metallic base, and a number of associated process steps.

In constructing the semiconductor arrangement of the invention, I prefer to use an aluminium oxide sintered plate having a thickness of 3 millimeters, a thermal conductivity of 30 Kcal/hm°C and a density of 3.8 g/cm$^3$. This plate is metallized with a 0.1 millimeters thick layer of silver. The semiconductor tablets are appropriately doped silicon. These are soldered to the metal layer using a solder of the following composition in weight percent: silver 45 %, copper 30 %, zinc 25 %.

In constructing the semiconductor arrangement of the invention, the number and positioning of the semiconductor tablets and the positioning of gaps 7 in the metal layer are determined by the desired circuitry and polarities. Conductors are then fixed to the metal layer and to the semiconductor tablets in any manner acceptable in the art. Care must be taken that the conductors in the final product are properly mutually separated and separated from the metal layer and tablets so that there is no danger of electrical breakdown.

I prefer to cast cover 5 in place and to use silicone resin of the following specifications: 2.8 g/cm$^3$, 180° C casting temperature. Milled alumina is added to the resin to improve its heat conductivity. The plastic has final heat conductivity, and density of, respectively, 20 $\cdot 10^{-4}$ cal/sec cm °C, and 2.8 g/cm$^3$. The casting is done using an injection molder.

It is also possible to use a sintered beryllium oxide plate in place of the aluminum oxide plate. The specifications of the beryllium oxide plate are as follows: Thermal conductivity : 0.6 cal/cm sec °C, Density : 2.9 g/cm$^3$.

To the end of economical mass production of the semiconductor arrangements of the present invention, the carrier 1 can be taken from an elongated piece provided with transverse notches 13 which are shown as existing on the under side in FIG. 3. The elongated piece is first metallized and provided with mounted semiconductor tablets and then split up as desired by separating at the notches 13. This technique is applicable equally for semiconductor arrangements of low current load and many components and for semiconductor rectifiers of medium and high current carrying capacity.

Among the advantages of the arrangement of the invention are, that use of a simply constructed metal oxide plate as both base and housing lower part provides a heat extracting ability almost equal to that of metallic carriers, and that a surprisingly simple, economical, and mechanically stable construction of semiconductor arrangements of different types is provided by the immediate connecting of a desired number of semiconductor tablets to an oxide plate and by their encasement, together with their conductors, with a hardening plastic mechanically secured to the plate.

The drawings are to scale in one example of the invention.

It will be understood that the above description of the present invention is susceptible to various modifications, changes and adaptations.

I claim:

1. A semiconductor arrangement, comprising:

a thermally conducting, electrically insulating, continuous plate-shaped, oxide ceramic carrier which is metallized on at least a portion of one face;

a semiconductor tablet mounted on and electrically contacted to said metallized portion of said one face;

electrical conductor means spaced from said one face and electrically contacting said semiconductor tablet for additionally tapping said semiconductor tablet;

a continuous plastic cover encasing said semiconductor tablet, the portion of said conductor means electrically contacting said tablet and said one face of said carrier, and extending over and covering a portion of the edge of said carrier in intimate contact therewith, said carrier having its face opposite said one face free of said plastic cover, whereby said opposite face may be thermally contacted for the extraction of heat; and means for mechanically securing said plastic cover to said carrier, said means for mechanically securing comprising a protruding rib and a mating indentation, one of which is formed on the surface of said edge of said carrier and the other of which is formed on the interior surface of said plastic cover.

2. A semiconductor arrangement as defined in claim 1 wherein said rib is arranged on said carrier.

3. A semiconductor arrangement as defined in claim 2, wherein said rib is continuous about the entire edge of said carrier.

4. A semiconductor arrangement as defined in claim 1, wherein said carrier is formed of a material selected from the group consisting of aluminum oxide, and beryllium oxide.

5. A semiconductor arrangement as defined in claim 4 wherein said carrier is formed of sintered aluminium oxide having a thermal conductivity of 30 Kcal/hm°C and a density of 3.8 g/cm$^3$.

6. A semiconductor arrangement as defined in claim 4 wherein said carrier is formed of sintered beryllium oxide having a thermal conductivity of 0.6 cal/cm sec°C and a density of 2.9g/cm$^3$.

7. A semiconductor arrangement as defined in claim 1 wherein said carrier has a rough surface whereby the adhesion of said cover to said carrier is improved.

8. A semiconductor arrangement as defined in claim 1 wherein said cover is formed of a silicone resin containing milled alumina.

9. A semiconductor arrangement as defined in claim 1, wherein said semiconductor tablet has a high current carrying capacity, and wherein said arrangement further comprises a conductor contacting said metallized face and a refractory metal piece interposed between said semiconductor tablet and said electrical conductor means for additionally tapping said semiconductor tablet.

10. A semiconductor arrangement as defined in claim 1 wherein said tablet is soldered to said metallized portion of said one face.

11. A semiconductor arrangement as defined in claim 10 further comprising at least one additional semiconductor tablet soldered to said metallized portion of said one face, said metallized portion being continuous between said tablets, said conductor means tapping said tablets to connect same in a rectifying circuit pattern.

12. A semiconductor arrangement as defined in claim 1, wherein said tablet is a semiconductor rectifier and said face of said carrier which is opposite said one face is planar, and further comprising a metal cooling plate thermally contacting said face opposite said one face, said metal cooling plate having a portion thereof which forms a spring clip means, which extends along the edge of said carrier and said cover and over the exposed surface of said cover, for causing said face opposite the metallized face to bear with force against said metal cooling plate for improved heat transfer.

13. A semiconductor arrangement as defined in claim 1 further comprising means for mounting said carrier on a support, said means comprising a pair of plate shape lugs with mounting holes, said lugs extending laterally from opposite edges of said carrier.

14. A semiconductor arrangement as defined in claim 1 wherein said electrical conductor means comprises an electrical conductor connected to said semiconductor tablet and extending directly therefrom through said cover to form an external lead for said semiconductor arrangement; and further comprising a further electrical conductor connected to said metallized portion of said one face and extending directly therefrom laterally beyond the edge of said carrier and through said cover to form a further external lead for said semiconductor arrangement.

* * * * *